(12) United States Patent
Ryan

(10) Patent No.: US 11,962,281 B2
(45) Date of Patent: Apr. 16, 2024

(54) SLOT ANTENNA

(71) Applicant: AchernarTek Inc., San Diego, CA (US)

(72) Inventor: Colan Ryan, San Diego, CA (US)

(73) Assignee: ACHERNARTEK INC., San Diego, CA (US)

(*) Notice: Subject to any disclaimer, the term of this patent is extended or adjusted under 35 U.S.C. 154(b) by 353 days.

(21) Appl. No.: 17/487,008

(22) Filed: Sep. 28, 2021

(65) Prior Publication Data

US 2022/0328972 A1 Oct. 13, 2022

Related U.S. Application Data

(60) Provisional application No. 63/173,546, filed on Apr. 12, 2021.

(51) Int. Cl.
| | | |
|---|---|---|
| *H01Q 1/38* | (2006.01) | |
| *H01P 1/18* | (2006.01) | |
| *H01Q 1/48* | (2006.01) | |
| *H01Q 3/36* | (2006.01) | |
| *H01Q 5/50* | (2015.01) | |
| *H01Q 9/04* | (2006.01) | |
| *H01Q 13/10* | (2006.01) | |
| *H01Q 21/06* | (2006.01) | |
| *H03H 7/20* | (2006.01) | |
| *H03H 7/48* | (2006.01) | |

(52) U.S. Cl.
CPC .............. *H03H 7/48* (2013.01); *H01P 1/184* (2013.01); *H01Q 1/38* (2013.01); *H01Q 1/48* (2013.01); *H01Q 3/36* (2013.01); *H01Q 5/50* (2015.01); *H01Q 9/045* (2013.01); *H01Q 13/106* (2013.01); *H01Q 21/065* (2013.01); *H03H 7/20* (2013.01)

(58) Field of Classification Search
CPC . H03H 7/48; H03H 7/20; H03H 7/185; H01P 1/184; H01Q 1/38; H01Q 1/48; H01Q 3/36; H01Q 5/50; H01Q 9/045; H01Q 13/106; H01Q 21/065
See application file for complete search history.

(56) References Cited

U.S. PATENT DOCUMENTS

| 3,696,433 | A | * | 10/1972 | Killion | ............... | H01Q 13/22 |
|---|---|---|---|---|---|---|
| | | | | | | 333/237 |
| 2001/0015705 | A1 | * | 8/2001 | Scordilis | ............ | H01Q 23/00 |
| | | | | | | 343/847 |
| 2005/0206568 | A1 | | 9/2005 | Phillips et al. | | |
| 2006/0273972 | A1 | | 12/2006 | Chandler | | |
| 2020/0259258 | A1 | * | 8/2020 | Amiri | ............... | H01Q 5/378 |

FOREIGN PATENT DOCUMENTS

| CN | 109638422 A | 4/2019 |
|---|---|---|
| CN | 110661089 A | 1/2020 |

* cited by examiner

*Primary Examiner* — David E Lotter
(74) *Attorney, Agent, or Firm* — McClure, Qualey & Rodack, LLP

(57) ABSTRACT

A slot antenna is disclosed. The slot antenna structure includes a dielectric substrate, a grounding plate and a resonator. The grounding plate is disposed over a first side of the dielectric substrate and defines a slot. The feeding strip is disposed over a second side of the dielectric substrate and opposite to the grounding plate. The resonator is coupled to the grounding plate and is disposed horizontally within the slot.

16 Claims, 8 Drawing Sheets

SLOT ANTENNA

RELATED APPLICATIONS

This application claims priority to U.S. Provisional Application Ser. No. 63/173,546, filed Apr. 12, 2021, which is herein incorporated by reference.

BACKGROUND

Field of the Invention

The disclosure relates to an antenna field, and more particularly to a slot antenna.

Description of Related Art

A resonant antenna is designed to operate at its resonant frequency, which is generally determined by its physical size. For example, a conventional slot antenna is resonant at a resonant frequency corresponding to a length of its slot which is a half of the wavelength of the signal therein. However, because of its fixed slot length, the conventional slot antenna typically has only a single resonant frequency as well as a limited bandwidth, which results in limited use for radio communication devices, such as smartphones, 5G femtocells, etc.

SUMMARY

One aspect of the present disclosure directs to a slot antenna which includes a dielectric substrate, a grounding plate and a first resonator. The grounding plate is disposed over a first side of the dielectric substrate and defines a slot. The feeding strip is disposed over a second side of the dielectric substrate and opposite to the grounding plate. The first resonator is coupled to the grounding plate and is disposed horizontally or vertically (e.g., using a bonding wire to form a three-dimensional resonator structure extending vertically) within the slot.

In accordance with one or more implementations of the present disclosure, the first resonator includes a first inductive element and a first capacitive element. The first inductive element is electrically coupled to the grounding plate. The first capacitive element is electrically connected to the first inductive element in series and is electrically coupled to the grounding plate.

In accordance with one or more implementations of the present disclosure, the first inductive element is a first meandered conductive line.

In accordance with one or more implementations of the present disclosure, the first capacitive element is a first conductive patch.

In accordance with one or more implementations of the present disclosure, the grounding plate and the first resonator are an integral structure.

In accordance with one or more implementations of the present disclosure, the slot antenna further includes a second resonator which is coupled to the grounding plate and electrically connected in parallel with the first resonator.

In accordance with one or more implementations of the present disclosure, the second resonator includes a second inductive element and a second capacitive element. The second inductive element is electrically coupled to the grounding plate. The second capacitive element is electrically connected to the second inductive element in series and is electrically coupled to the grounding plate.

In accordance with one or more implementations of the present disclosure, the second inductive element is a second meandered conductive line.

In accordance with one or more implementations of the present disclosure, the second capacitive element is a second conductive patch.

In accordance with one or more implementations of the present disclosure, the second conductive patch is overlapped with the grounding plate in a top view of the slot antenna.

In accordance with one or more implementations of the present disclosure, the second resonator is overlapped with the slot in a top view of the slot antenna.

In accordance with one or more implementations of the present disclosure, the second resonator is disposed horizontally or vertically within the slot.

In accordance with one or more implementations of the present disclosure, the grounding plate, the first resonator and the second resonator are an integral structure.

In accordance with one or more implementations of the present disclosure, the slot antenna further includes a conductive via which penetrates through the dielectric substrate and is electrically connected to the second resonator and the grounding plate. The second resonator is disposed over the second side of the dielectric substrate.

In accordance with one or more implementations of the present disclosure, the first resonator and the second resonator are overlapped in a top view of the slot antenna.

Another aspect of the present disclosure is directed to a slot antenna which includes a grounding plate, a feeding strip and a resonator. The grounding plate is disposed over a first side of the dielectric substrate and defines a slot. The feeding strip is disposed over a second side of the dielectric substrate and opposite to the grounding plate. The resonator is electrically connected to grounding plate, is disposed over the second side of the dielectric substrate, and is overlapped with the slot.

In accordance with one or more implementations of the present disclosure, the first resonator includes an inductive element and a capacitive element. The inductive element is electrically connected or capacitively/inductively coupled to the grounding plate. The capacitive element is electrically connected or capacitively/inductively coupled to the inductive element in series and is electrically coupled to the grounding plate.

In accordance with one or more implementations of the present disclosure, the inductive element is a meandered conductive line.

In accordance with one or more implementations of the present disclosure, the capacitive element is a conductive patch.

In accordance with one or more implementations of the present disclosure, the slot antenna further includes a conductive via which penetrates through the dielectric substrate and is electrically connected to the resonator and the grounding plate.

BRIEF DESCRIPTION OF THE DRAWINGS

The foregoing aspects and many of the accompanying advantages of this disclosure will become more readily appreciated as the same becomes better understood by reference to the following detailed description, when taken in conjunction with the accompanying drawings.

DETAILED DESCRIPTION

The detailed explanation of the disclosure is described as following. The described preferred embodiments are presented for purposes of illustrations and description, and they are not intended to limit the scope of the disclosure. Moreover, any device with equivalent functions that is produced from a structure formed by a recombination of elements shall fall in the scope of the present disclosure. Additionally, the drawings are only illustrative and are not drawn to actual size.

Terms used herein are only used to describe the specific embodiments, which are not used to limit the claims appended herewith. Unless limited otherwise, the term "a," "an," "one" or "the" of the single form may also represent the plural form.

The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the following description and claims, the term "coupled" along with their derivatives, may be used. In particular embodiments, "coupled" may be used to indicate that two or more elements are in direct physical or electrical contact with each other, or may also mean that two or more elements may not be in direct contact with each other. "Coupled" may still be used to indicate that two or more elements cooperate or interact with each other.

It will be understood that, although the terms "first" and "second" may be used herein to describe various elements and/or components, these elements and/or components should not be limited by these terms. These terms are only used to distinguish elements and/or components.

Figure 1A:
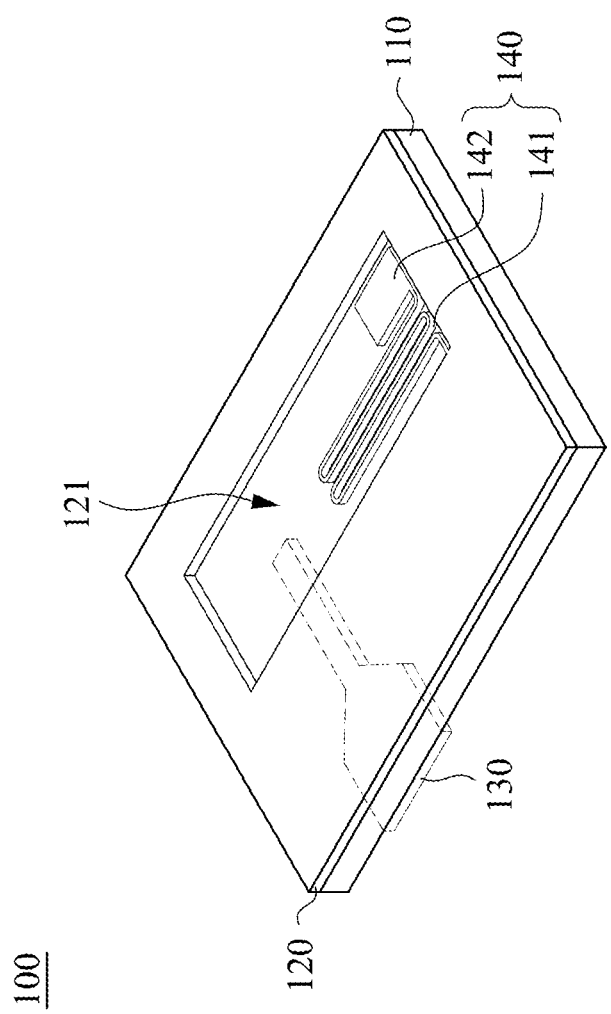
FIG. 1A is a stereoscopic view of a slot antenna in accordance with some implementations of the present disclosure.

FIG. 1A is a stereoscopic view of a slot antenna 100 in accordance with some implementations of the present disclosure in which a single feeding signal is applied to a single slot antenna. As shown in FIG. 1A, the slot antenna 100 includes a dielectric substrate 110, a grounding plate 120, a feeding strip 130 and a resonator 140. The grounding plate 120 and the feeding strip 130 are respectively over two opposite sides of the dielectric substrate 110. Also referring to FIG. 1B, which is a top view of the slot antenna 100 shown in FIG. 1A, the grounding plate 120 defines a slot 121 which exposes the dielectric substrate 110. The slot 121 may be a closed rectangular slot with a length $L_{121}$, and the feeding strip 130 is overlapped with the slot 121 in the top view of the slot antenna 100 for electromagnetic excitation of the slot antenna 100. Another shape (such as circular, square, etc.) of the slot 121 may be defined to form the slot 121 according to various design requirements. The feeding strip 130 may be a microstrip, a stripline, a waveguide, a coplanar waveguide (CPW), a coplanar stripline (CPS), or the like. The resonator 140 is arranged in the slot 121, and is coupled to the grounding plate 120. The resonator 140 may be electrically connected or capacitively/inductively coupled to the grounding plate 120. The resonator 140 may be disposed in the same metal layer as the grounding plate 120. In some implementations, the grounding plate 120 and the resonator 140 are simultaneously formed by the same process to be an integral structure.

Alternatively, the resonator 140 may be a three-dimensional resonator structure which is formed by using a bonding wire, and may extend vertically to the opposite side of the substrate 110.

Figure 1B:
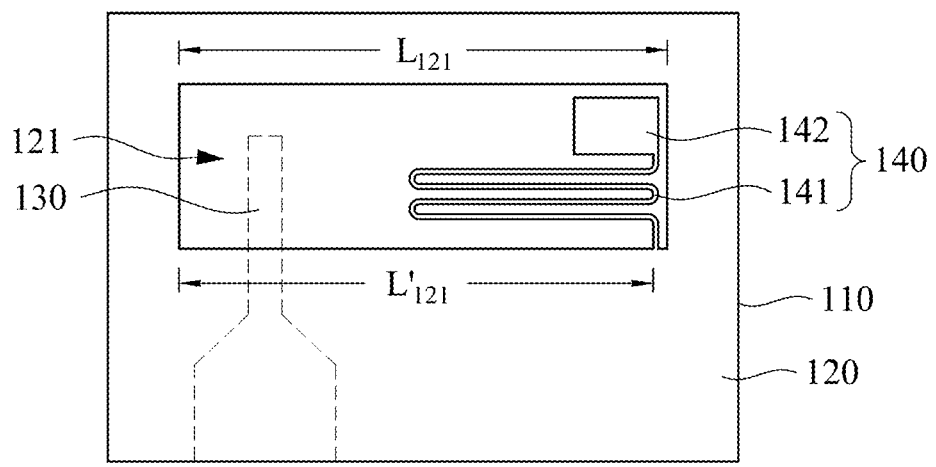
FIG. 1B is a top view of the slot antenna shown in FIG. 1A.

In particular, the resonator 140 includes a meandered conductive line 141 and a conductive patch 142 that are coupled in series. The meandered conductive line 141 and the conductive patch 142 are placed close to the edge of the slot to avoid disrupting the slot antenna's current. The meandered conductive line 141 may have rounded corners or sharp corners. Two ends of the meandered conductive line 141 are respectively coupled to the grounding plate 120 and the conductive patch 142. The conductive patch 142 is physically separated from the grounding plate 120 to function as a capacitor. As shown in FIG. 1B, the meandered conductive line 141 is electrically connected or capacitively/inductively coupled to the grounding plate 120 at one longer edge of the slot 121, and the conductive patch 142 is electrically coupled to the grounding plate 120 at the other longer edge of the slot 121. A distance $L'_{121}$ from the shorter edge of the slot 121 to the end the meandered conductive line 141 connected to the grounding plate 120 along the direction toward the other shorter edge of the slot 121 is shorter than the length $L_{121}$ of the slot 121.

The dielectric substrate 110 may be an FR4 substrate, a glass substrate, a ceramic substrate, an epoxy resin substrate, a silicon substrate, and/or another substrate with suitable dielectric material. The grounding plate 120, the feeding strip 130, the meandered conductive line 141 and the conductive patch 142 may be formed form copper, aluminum, nickel and/or another metal, a mixture or a metal alloy thereof, an electrically conductive metallic compound, and/or another suitable conductive material. The pattern of the meandered conductive line 141 and/or the conductive patch 142 may be modified depending on the design requirements of the slot antenna 100, and is not limited to that shown in FIGS. 1A and 1B.

The slot antenna 100 resonates at a resonant frequency corresponding to the wavelength of the signal in the slot antenna 100 which is a double of the length $L_{121}$ of the slot 121. In addition, the resonator 140 produces a resonance that couples to the resonant mode of the slot antenna 100, and this coupling of two resonances increases the bandwidth of the slot antenna 100. The resonator 140 is placed close to the edge of the slot 121 to avoid disrupting the original current distribution of the slot antenna 100, and the resonator 140 is tuned to be close to the fundamental operating frequency of the slot 121. The resonator 140 does not act as a filter and thus the entire slot 121 is used as radiating structure. No part of the slot 121 is short-circuited at any frequency.

Figure 1C:
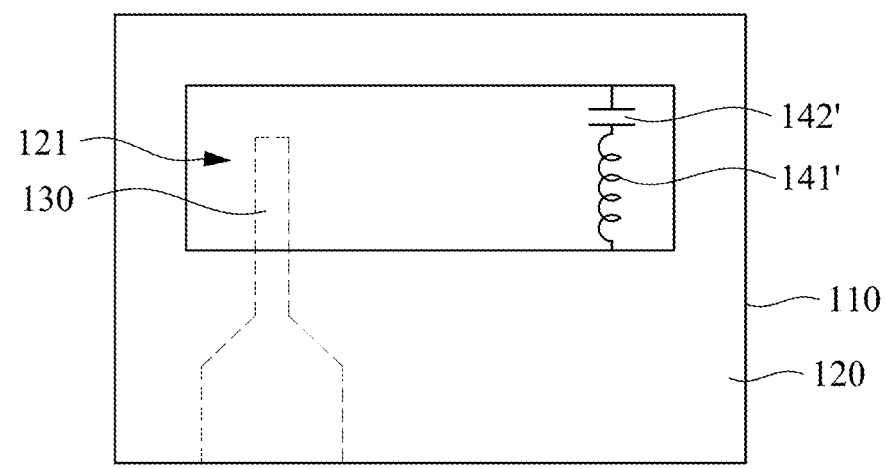
FIG. 1C shows an equivalent circuit of the resonator in FIG. 1B.

FIG. 1C shows an equivalent circuit of the resonator 140 in FIG. 1B, in which the meandered conductive line 141 and the conductive patch 142 are represented respectively by an inductor 141' and a capacitor 142'. According to the equivalent circuit shown in FIG. 10, in some other implementations, the inductor 141' may be implemented by an inductive element other than the meandered conductive line 141 (such as a thin straight wire), and/or the capacitor 142' may be implemented by a capacitive element other than the conductive patch 142 (such as two electrodes patterned in an interdigitated manner).

Figure 2A:
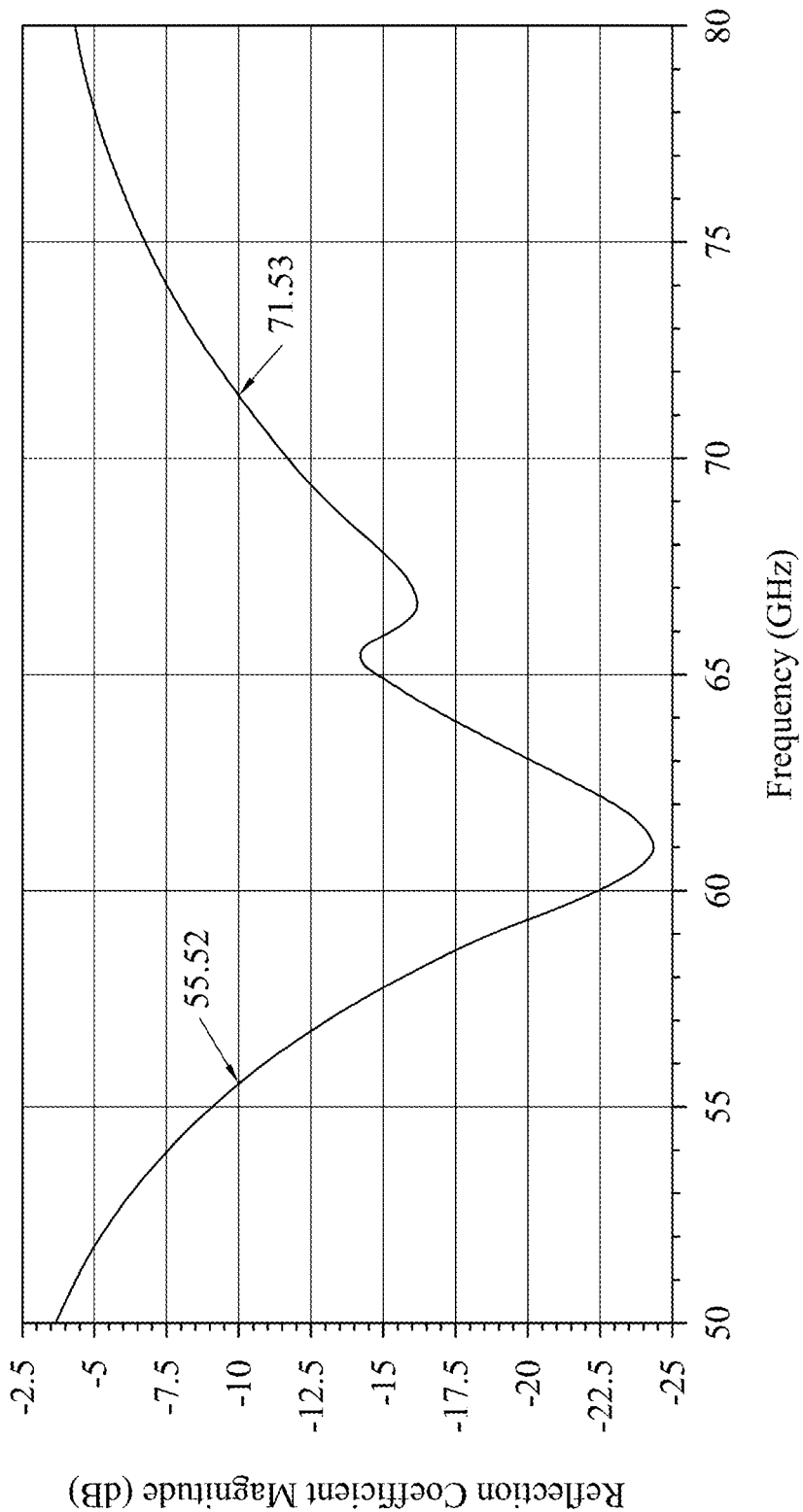
FIG. 2A is a plot depicting the reflection coefficient magnitude of the slot antenna shown in FIGS. 1A and 1B.
Figure 2B:
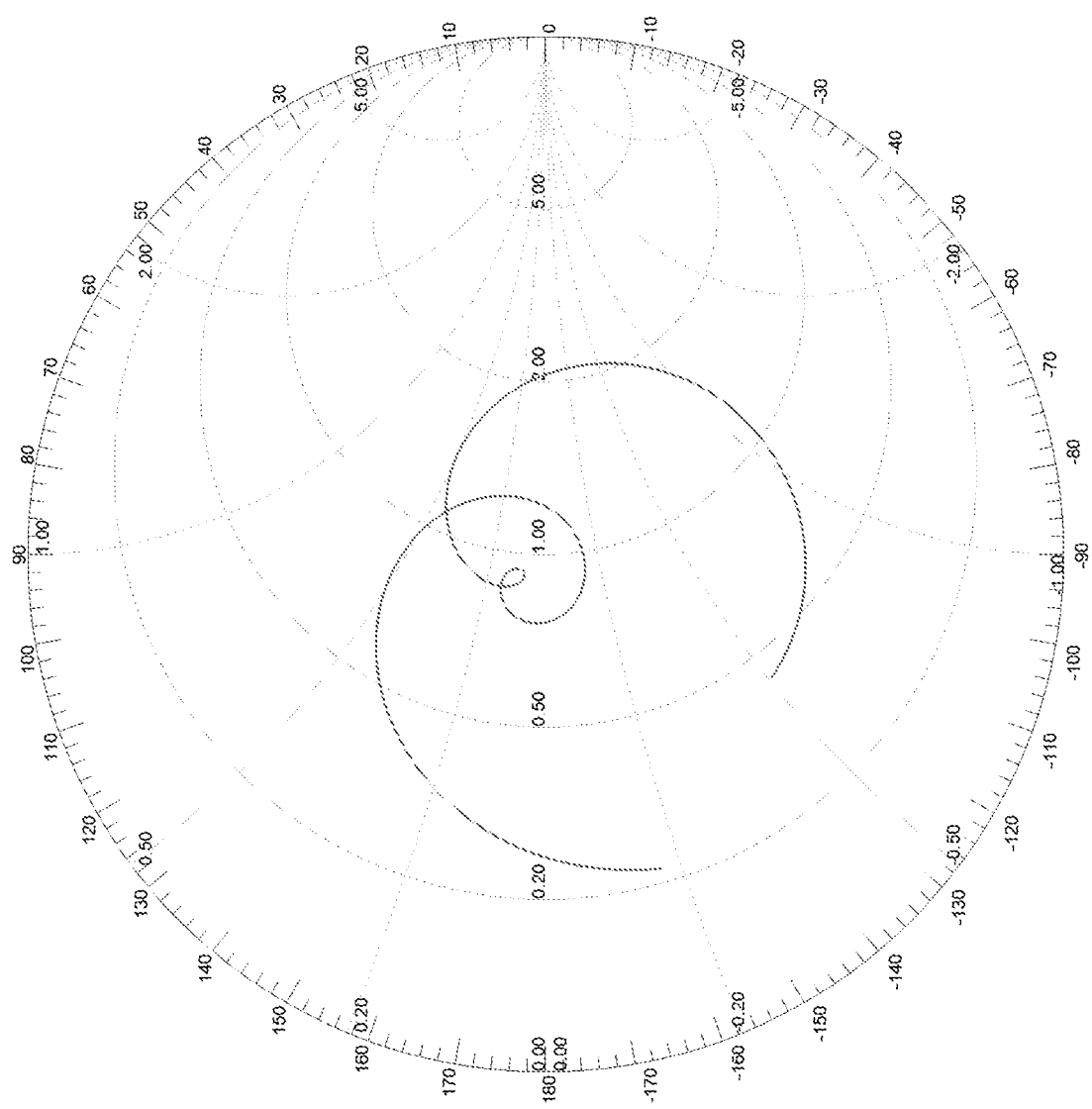
FIG. 2B is a Smith chart depicting the S11 parameter of the slot antenna in FIGS. 1A and 1B.

FIG. 2A is a plot depicting the reflection coefficient magnitude of the slot antenna 100 shown in FIGS. 1A and 1B. As shown in FIG. 2A, the frequency band in which the reflection coefficient magnitude of the first feed network is less than −10 dB is in a range from about 55.52 GHz to about 71.53 GHz. Moreover, FIG. 2B is a Smith chart depicting the S11 parameter of the slot antenna 100 in FIGS. 1A and 1B. It can be observed from the S11 parameter curve in FIG. 2B that the slot antenna 100 generates dual resonances. As can be seen from FIGS. 2A and 2B, the slot antenna 100 with the resonator 140 adds an additional resonance and therefore increases the bandwidth for operation.

Figure 3A:
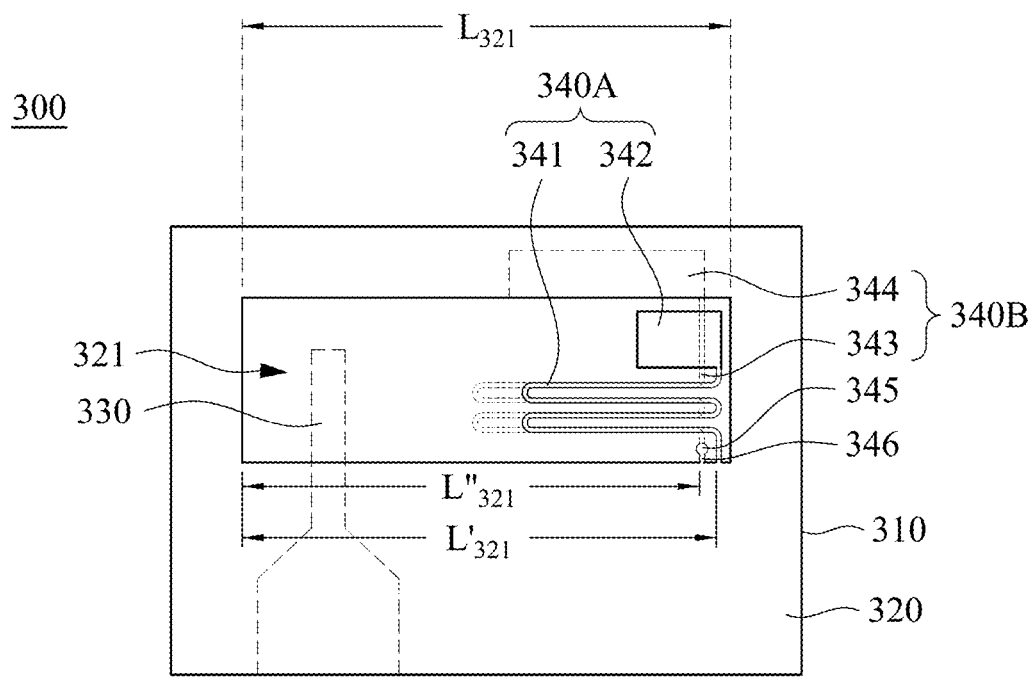
FIG. 3A is a top view of a slot antenna in accordance with some implementations of the present disclosure.

FIG. 3A is a top view of a slot antenna 300 in accordance with some implementations of the present disclosure. As shown in FIG. 3A, the slot antenna 300 includes a dielectric substrate 310, a grounding plate 320, a feeding strip 330 and resonators 340A and 340B. The grounding plate 320 defines a slot 321 which exposes the dielectric substrate 310. The slot 321 may be a closed rectangular slot with a length $L_{321}$. The feeding strip 330 is overlapped with the slot 321 in the top view of the slot antenna 300. The structure of the dielectric substrate 310, the grounding plate 320, the slot 321 and the feeding strip 330 may be the same as or similar to that of the dielectric substrate 110, the grounding plate 120, the slot 121 and the feeding strip 130 of the slot antenna 100. In addition, the types and/or the materials of the dielectric substrate 310, the grounding plate 320 and the feeding strip 330 may be respectively the same as or similar to those of the dielectric substrate 110, the grounding plate 120 and the feeding strip 130 of the slot antenna 100.

The resonator 340A is arranged in the slot 321, and is coupled to the grounding plate 320. The resonator 340A may be electrically connected or capacitively/inductively coupled to the grounding plate 320. The resonator 340A is disposed in the same metal layer as the grounding plate 320. In some implementations, the grounding plate 320 and the resonator 340A are simultaneously formed by the same process to be an integral structure.

In particular, the resonator 340A includes a meandered conductive line 341 and a conductive patch 342 that are coupled in series. As shown in FIG. 3A, the meandered conductive line 341 is electrically connected or capacitively/inductively coupled to the grounding plate 320 at one longer edge of the slot 321, and the conductive patch 342 is electrically coupled to the grounding plate 320 at the other longer edge of the slot 321. A distance $L'_{321}$ from the shorter edge of the slot 321 to the end the meandered conductive line 341 connected to the grounding plate 320 along the direction toward the other shorter edge of the slot 321 is shorter than the length $L_{321}$ of the slot 321.

The resonator 340B is disposed in the same metal layer as the feeding strip 330. The resonator 340B may be electrically connected or capacitively/inductively coupled to the grounding plate 320. In some implementations, the feeding strip 330 and the resonator 340B are simultaneously formed by the same process. Similarly, the resonator 340B includes a meandered conductive line 343 and a conductive patch 344 that are coupled in series. As shown in FIG. 3A, the meandered conductive line 343 is electrically connected to the grounding plate 320 through a via 345 and a connection line 346 at one longer edge of the slot 321, and the conductive patch 344 is electrically coupled to the grounding plate 320 at the other longer edge of the slot 321. The resonators 340A and 340B may be overlapped in the top view of the slot antenna 300 because they are respectively over two opposite sides of the dielectric substrate 310. For example, as shown in FIG. 3A, the meandered conductive lines 341 and 343 are overlapped in the top view of the slot antenna 300. The conductive patch 344 may be overlapped with the grounding plate 320 in the top view of the slot antenna 300 to function as a capacitor. The via 345 penetrates through the dielectric substrate 310 to connect the meandered conductive line 343 and one end of the connection line 346, and the other end of the connection line 346 contacts the grounding plate 320. A distance $L''_{321}$ from the shorter edge of the slot 321 to the end of the connection line 346 connected to the grounding plate 320 along the direction toward the other shorter edge of the slot 321 is shorter than the length $L_{321}$ of the slot 321 and the distance $L'_{321}$. In some other embodiments, the via 345 directly contacts the grounding plate 320, and hence the connection line 346 can be omitted.

Similar to the slot antenna 100, the dielectric substrate 310 may be an FR4 substrate, a glass substrate, a ceramic substrate, an epoxy resin substrate, a silicon substrate, and/or another substrate with suitable dielectric material, and the grounding plate 320, the feeding strip 330, the meandered conductive lines 341 and 343, the conductive patches 342 and 344, the via 345 and the connection line 346 may be formed form copper, aluminum, nickel and/or another metal, a mixture or a metal alloy thereof, an electrically conductive metallic compound, and/or another suitable conductive material.

The slot antenna 300 resonates at a resonant frequency corresponding to the wavelength of the signal in the slot antenna 300 which is a double of the length $L_{321}$ of the slot 321. In addition, the resonator 340A, which is tuned to be close to the fundamental operating frequency of the slot 321, produces a resonance that couples to the resonant mode of the slot antenna 300. Moreover, the resonator 340B, which is also tuned to be close to the fundamental operating frequency of the slot 321, also produces a resonance that couples to the resonant mode of the slot antenna 300. The tuning frequencies of the resonators 340A and 340B are different from each other, and are chosen to optimize the overall bandwidth. Further, the resonators 340A and 340B are both placed close to the edge of the slot 321 to avoid disrupting the current distribution of the slot antenna 300. Therefore, the slot antenna 300 couples to the resonances produced by each of the resonators 340A and 340B, which results in the increasing of the bandwidth of the slot antenna 300.

The profiles of the resonators 340A and 340B may be modified in various implementations according to the present disclosure. For example, in some other implementations, the meandered conductive line 341 and the conductive patch 342 are disposed in the same metal layer as the feeding strip 330, the meandered conductive line 343 and the conductive patch 344 are in the same metal layer as the grounding plate 320, and the via 345 and the connection line 346 may be modified to electrically connect the meandered conductive line 341 with the grounding plate 320. In addition, the positions of the resonators 340A and 340B may be adjusted, so that the resonators 340A and 340B are non-overlapped in the top view of the slot antenna 300.

The resonator 340A of the slot antenna 300 may be the same as or similar to the resonator 140 of the slot antenna 100 shown in FIGS. 1A and 1B. Moreover, in some implementations, the slot antenna 100 may be altered by substituting the resonator 140 with the resonator 340B, the via 345 and the connection line 346 of the slot antenna 300 to have the same equivalent circuit as that shown in FIG. 10.

Figure 3B:
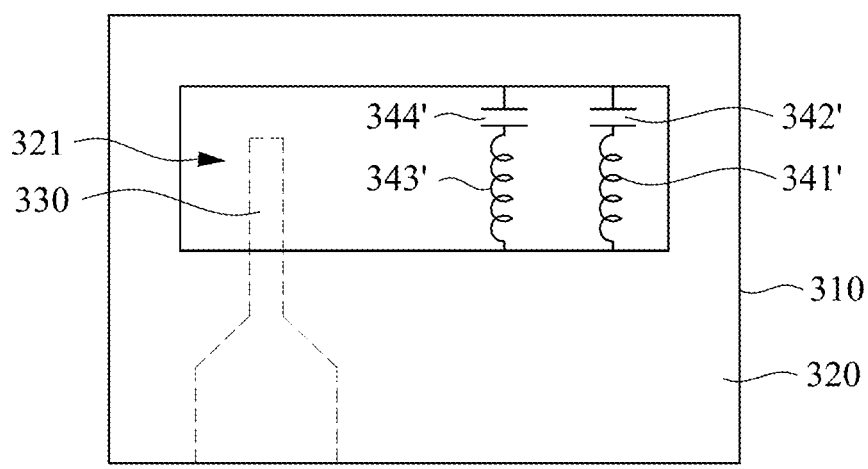
FIG. 3B shows an equivalent circuit of the resonators in FIG. 3A.

FIG. 3B shows an equivalent circuit of the resonators 340A and 340B in FIG. 3A, in which the meandered conductive lines 341 and 343 and the conductive patches 342 and 344 are represented respectively by inductors 341' and 343' and capacitors 342' and 344'. The series of the inductor 341' and the capacitor 342' is electrically connected in parallel with the series of the inductor 343' and the capacitor 344'. According to the equivalent circuit shown in FIG. 3B, in some other implementations, each of the inductors 341' and 343' may be implemented by an inductive element other than the meandered conductive lines 341 and 343 (such as a thin straight wire), and/or each of the capacitors 342' and 344' may be implemented by a capacitive element other than the conductive patches 342 and 344 (such as two electrodes patterned in an interdigitated manner).

Figure 4:
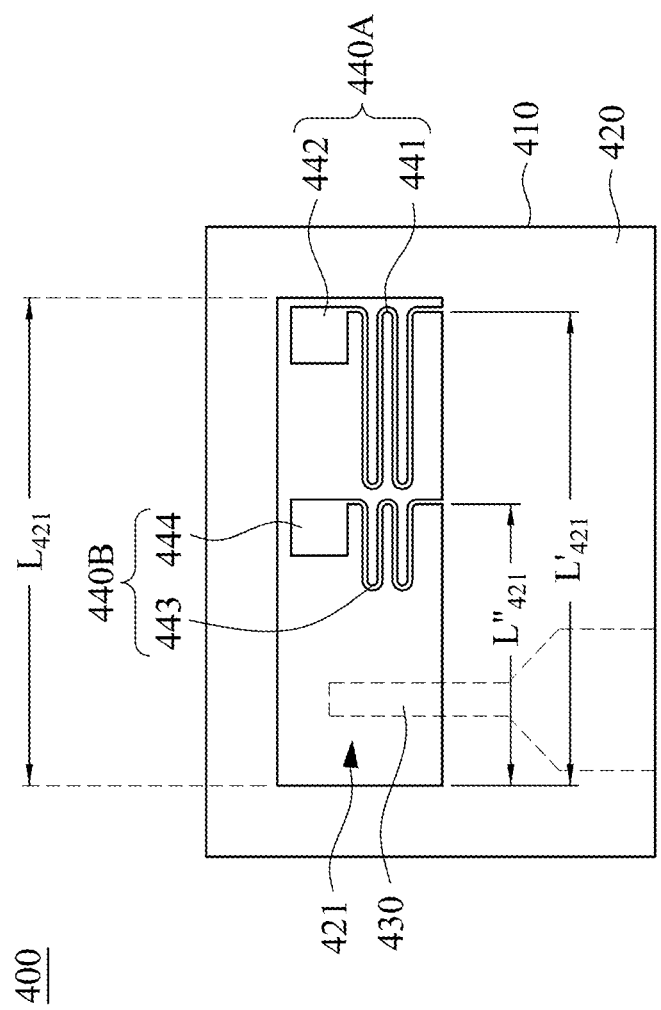
FIG. 4 is a top view of a slot antenna in accordance with some implementations of the present disclosure.

FIG. 4 is a top view of a slot antenna 400 in accordance with some implementations of the present disclosure. As shown in FIG. 4, the slot antenna 400 includes a dielectric substrate 410, a grounding plate 420, a feeding strip 430 and resonators 440A and 440B. The grounding plate 420 defines a slot 421 which exposes the dielectric substrate 410. The slot 421 may be a closed rectangular slot with a length $L_{421}$. The feeding strip 430 is overlapped with the slot 421 in the top view of the slot antenna 400. The structure of the dielectric substrate 410, the grounding plate 420, the slot 421 and the feeding strip 430 may be the same as or similar to that of the dielectric substrate 110, the grounding plate 120, the slot 121 and the feeding strip 130 of the slot antenna 100. In addition, the types and/or the materials of the dielectric substrate 410, the grounding plate 420 and the feeding strip 430 may be respectively the same as or similar to those of the dielectric substrate 110, the grounding plate 120 and the feeding strip 130 of the slot antenna 100.

The resonators 440A and 440B are arranged in the slot 421, and are coupled to the grounding plate 420. The resonators 440A and 440B may be electrically connected or capacitively/inductively coupled to the grounding plate 420. The resonators 440A and 440B are disposed in the same metal layer as the grounding plate 420, and are non-overlapped in the top view of the slot antenna 400. In some implementations, the grounding plate 420 and the resonator 440A and 440B are simultaneously formed by the same process to be an integral structure.

In particular, the resonator 440A includes a meandered conductive line 441 and a conductive patch 442 that are coupled in series, and the resonator 440B includes a meandered conductive line 443 and a conductive patch 444 that are coupled in series. As shown in FIG. 4, the meandered conductive lines 441 and 443 are electrically connected to the grounding plate 420 at one longer edge of the slot 421, and the conductive patches 442 and 444 are electrically coupled to the grounding plate 420 at the other longer edge of the slot 421. A distance $L'_{421}$ from the shorter edge of the slot 421 to the end the meandered conductive line 441 connected to the grounding plate 420 and a distance $L''_{421}$ from the shorter edge of the slot 421 to the end the meandered conductive line 443 connected to the grounding plate 420 along the direction toward the other shorter edge of the slot 421 are all shorter than the length $L_{421}$ of the slot 421, and the distance $L''_{421}$ is shorter than the distance $L'_{421}$. The type and/or the material of each of the resonators 440A and 440B of the slot antenna 400 may be the same as or similar to that of the resonator 140 of the slot antenna 100 shown in FIGS. 1A and 1B.

The slot antenna 400 resonates at a resonant frequency corresponding to the wavelength of the signal in the slot antenna 400 which is a double of the length $L_{421}$ of the slot 421. In addition, the resonator 440A, which is tuned to be close to the fundamental operating frequency of the slot 421, produces a resonance that couples to the resonant mode of the slot antenna 400. Moreover, the resonator 440B, which is also tuned to be close to the fundamental operating frequency of the slot 421, also produces a resonance that couples to the resonant mode of the slot antenna 400. The tuning frequencies of the resonators 440A and 440B are different from each other, and are chosen to optimize the overall bandwidth. Further, the resonators 440A and 440B are both placed close to the edge of the slot 421 to avoid disrupting the current distribution of the slot antenna 400. Therefore, the slot antenna 400 couples to the resonances produced by each of the resonators 440A and 440B, which results in the increasing of the bandwidth of the slot antenna 400.

Figure 5A:
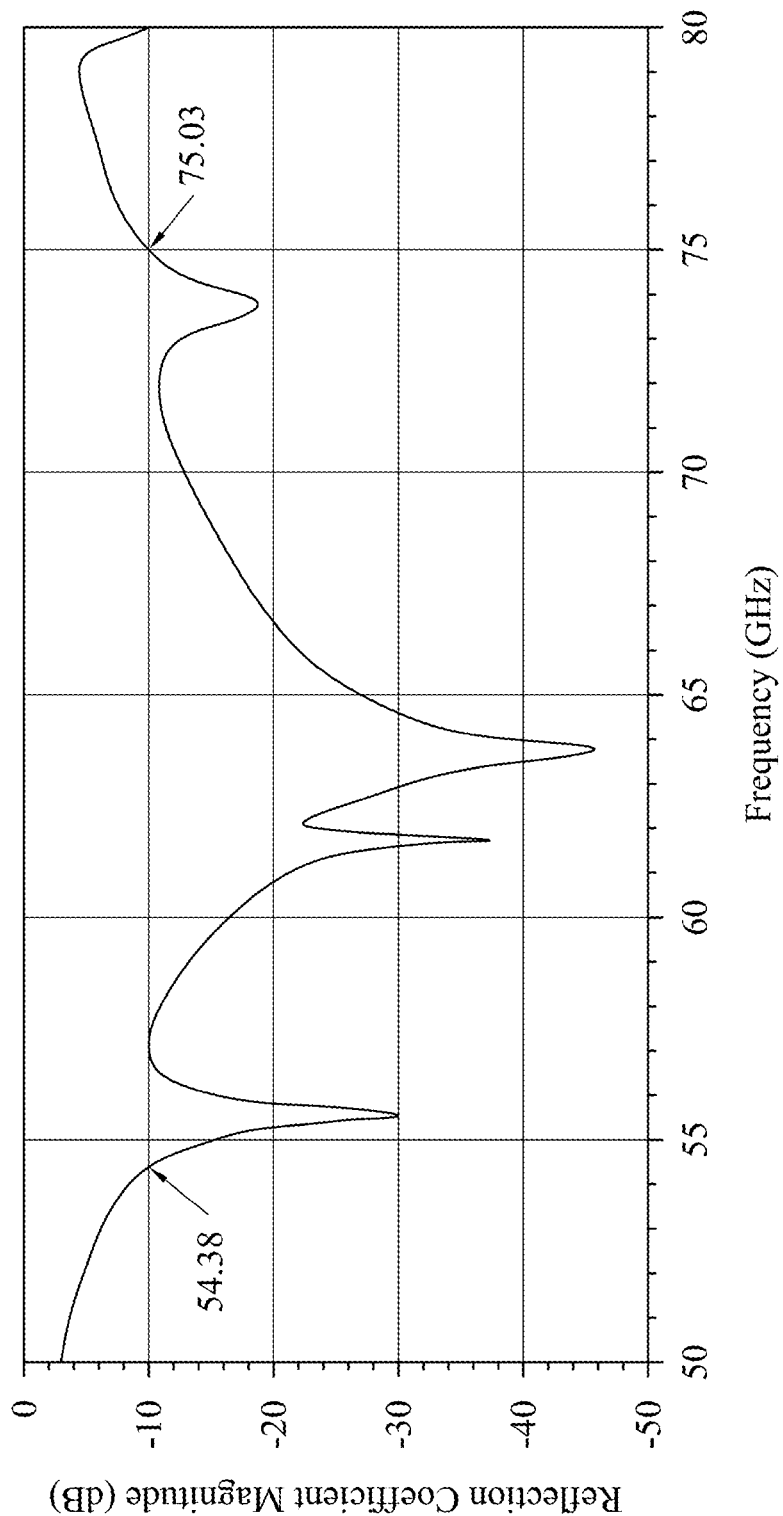
FIG. 5A is a plot depicting the reflection coefficient magnitude of the slot antenna shown in FIG. 3A.
Figure 5B:
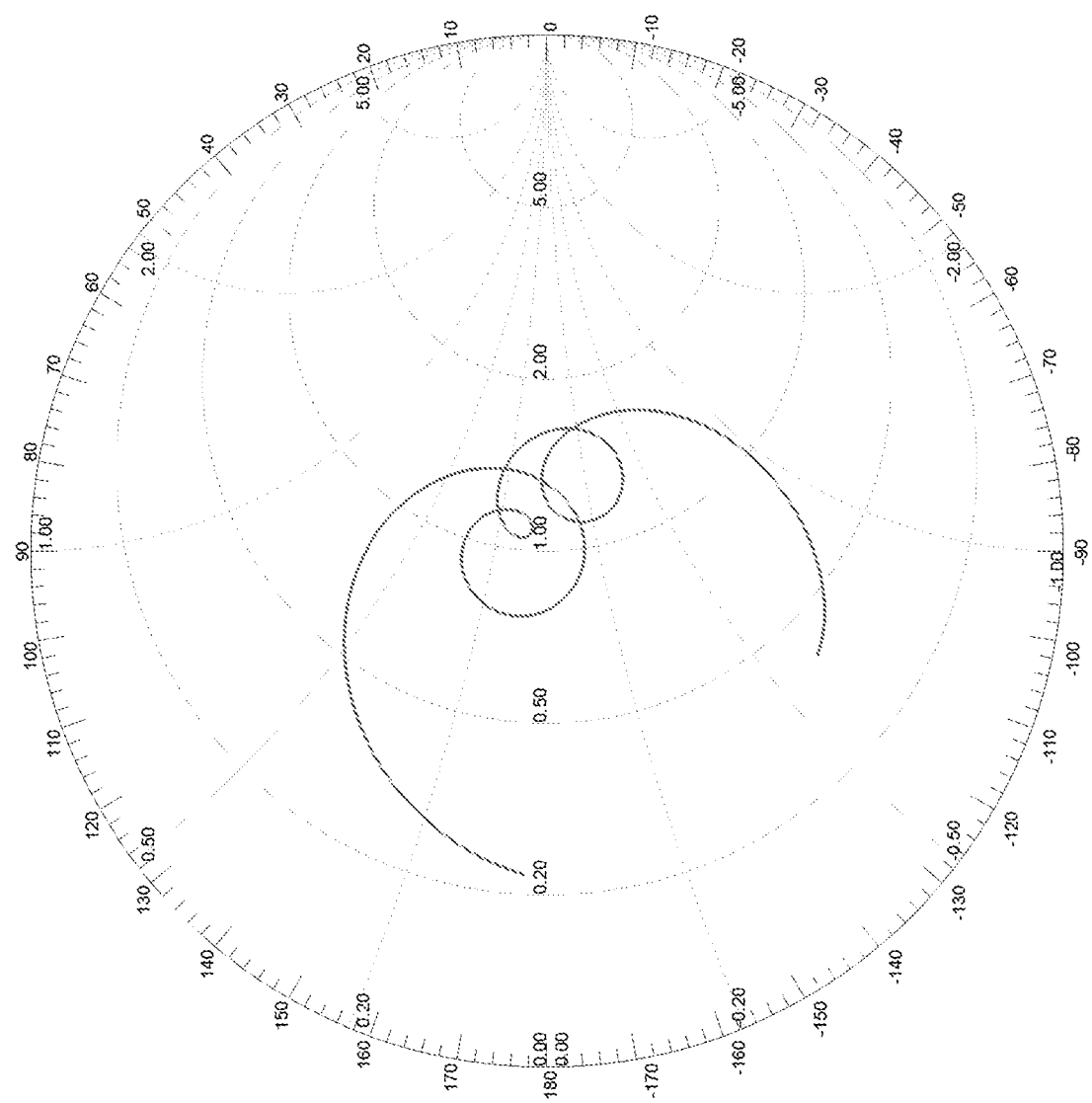
FIG. 5B is a Smith chart depicting the S11 parameter of the slot antenna in FIG. 3A.

FIG. 5A is a plot depicting the reflection coefficient magnitude of the slot antenna 300 shown in FIG. 3A. As shown in FIG. 5A, the frequency band in which the reflection coefficient magnitude of the first feed network is less than −10 dB is in a range from about 54.38 GHz to about 75.03 GHz. Moreover, FIG. 5B is a Smith chart depicting the S11 parameter of the slot antenna 300 in FIG. 3A. It can be observed from the S11 parameter curve in FIG. 5B that the slot antenna 300 generates triple resonances. As can be seen from FIGS. 5A and 5B, the slot antenna 300 with the resonators 340A and 340B adds two additional resonances and therefore increases the bandwidth for operation. Similar to the slot antenna 300, as can be expected, the slot antenna 400 shown in FIG. 4 also generates triple resonances, and therefore increases the bandwidth for operation.

It is noted that the present disclosure is not limited to the slot antenna 100 shown in FIGS. 1A and 1B, the slot antenna 300 shown in FIG. 3A and the slot antenna 400 shown in FIG. 4. A person having ordinary skill in the art would be able to modify the slot antenna described herein to arrive at a slot antenna with more than two resonators electrically connected in parallel according to the implementations described above.

The implementations of the present disclosure described above increase bandwidth of a slot antenna by introducing one or more extra resonators but without increasing its overall size and requiring additional material layers and processes, so as to reduce its manufacture cost. Alternatively, more substrate layer(s) and metal layer (s) may be added, and additional resonators may be disposed on these additional layers in a manner similar to that described herein.

It will be apparent to those skilled in the art that various modifications and variations can be made to the structure of the disclosure without departing from the scope or spirit of the disclosure. In view of the foregoing, it is intended that the disclosure covers modifications and variations of this disclosure provided they fall within the scope of the following claims.

What is claimed is:
1. A slot antenna comprising:
a dielectric substrate;

a grounding plate disposed over a first side of the dielectric substrate and defining a slot;

a feeding strip disposed over a second side of the dielectric substrate and opposite to the grounding plate; and a first resonator coupled to the grounding plate and disposed horizontally within the slot, the first resonator comprising:

a first meandered conductive line electrically coupled to the grounding plate; and a first conductive patch electrically connected to the first meandered conductive line in series and electrically coupled to the grounding plate.

2. The slot antenna of claim 1, wherein the first resonator is capacitively or inductively coupled to the grounding plate.

3. The slot antenna of claim 1, wherein the grounding plate and the first resonator are an integral structure.

4. The slot antenna of claim 1, further comprising:

a second resonator coupled to the grounding plate and electrically connected in parallel with the first resonator.

5. The slot antenna of claim 4, wherein the second resonator comprises:

a second inductive element electrically coupled to the grounding plate; and a second capacitive element electrically connected to the second inductive element in series and electrically coupled to the grounding plate.

6. The slot antenna of claim 5, wherein the second inductive element is a second meandered conductive line, and wherein the second capacitive element is a second conductive patch.

7. The slot antenna of claim 4, wherein the second resonator is capacitively or inductively coupled to the grounding plate.

8. The slot antenna of claim 6, wherein the second conductive patch is overlapped with the grounding plate in a top view of the slot antenna.

9. The slot antenna of claim 4, wherein the second resonator is overlapped with the slot in a top view of the slot antenna.

10. The slot antenna of claim 4, further comprising:

a conductive via penetrating through the dielectric substrate and electrically connected to the second resonator and the grounding plate;

wherein the second resonator is disposed over the second side of the dielectric substrate.

11. The slot antenna of claim 10, wherein the first resonator and the second resonator are overlapped in a top view of the slot antenna.

12. The slot antenna of claim 4, wherein the second resonator is disposed horizontally within the slot.

13. The slot antenna of claim 12, wherein the grounding plate, the first resonator and the second resonator are an integral structure.

14. A slot antenna comprising:

a dielectric substrate;

a grounding plate disposed over a first side of the dielectric substrate and defining a slot;

a feeding strip disposed over a second side of the dielectric substrate and opposite to the grounding plate; and a resonator coupled to the grounding plate and disposed over the second side of the dielectric substrate, the resonator overlapped with the slot, and the resonator comprising:

a meandered conductive line electrically coupled to the grounding plate; and a conductive patch electrically connected to the meandered conductive line in series and electrically coupled to the grounding plate.

15. The slot antenna of claim 14, wherein the resonator is capacitively or inductively coupled to the grounding plate.

16. The slot antenna of claim 14, further comprising:

a conductive via penetrating through the dielectric substrate and electrically connected to the resonator and the grounding plate.

* * * * *